United States Patent
Henmi

(10) Patent No.: US 7,498,663 B2
(45) Date of Patent: Mar. 3, 2009

(54) SEMICONDUCTOR INTEGRATED CIRCUIT

(75) Inventor: Takuya Henmi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 282 days.

(21) Appl. No.: 10/921,172

(22) Filed: Aug. 19, 2004

(65) Prior Publication Data
US 2005/0040500 A1    Feb. 24, 2005

(30) Foreign Application Priority Data
Aug. 20, 2003    (JP) .............................. 2003-295958

(51) Int. Cl.
*H01L 23/552*    (2006.01)
(52) U.S. Cl. ...................... 257/659; 257/660
(58) Field of Classification Search ................. 257/659, 257/660, 758; 438/731
See application file for complete search history.

(56) References Cited

U.S. PATENT DOCUMENTS

| | | | |
|---|---|---|---|
| 4,796,084 A * | 1/1989 | Kamasaki et al. ........... | 257/749 |
| 5,325,094 A | 6/1994 | Broderick et al. | |
| 5,329,155 A * | 7/1994 | Lao et al. ................... | 257/538 |
| 5,406,630 A | 4/1995 | Piosenka et al. | |
| 6,496,119 B1 | 12/2002 | Otterstedt et al. | |
| 6,822,279 B2 * | 11/2004 | Soeda ......................... | 257/296 |
| 6,888,063 B1 * | 5/2005 | Lien et al. ................. | 174/35 R |
| 2003/0141501 A1 | 7/2003 | Komurasaki et al. | |

FOREIGN PATENT DOCUMENTS

| | | |
|---|---|---|
| JP | 02-209735 | 8/1990 |
| JP | 5-74771 A | 3/1993 |

* cited by examiner

*Primary Examiner*—S. V. Clark
(74) *Attorney, Agent, or Firm*—Birch, Stewart, Kolasch & Birch, LLP

(57) ABSTRACT

In a semiconductor integrated circuit (100) having a shielding film (1) formed by a material different from at least either of a semiconductor substrate (4) and an interlayer insulating film (7) in thermal expansion coefficient, the shielding film (1) has shielding portions (9) and openings (12), and at least either of a plurality of independent openings (12a) whose circumferences are surrounded by the shielding portions (9) and a plurality of independent shielding portions (11) whose circumferences are surrounded by the openings (12) is present and scattered on the entire surface of a chip. Or, a plurality of openings (12) are present on an optional straight line parallel with the surface (4a) of the semiconductor substrate (4) passing through a portion for shielding circuit devices (21) and circuit wirings (16) in the shielding portions (9).

24 Claims, 19 Drawing Sheets

SEMICONDUCTOR INTEGRATED CIRCUIT

This Nonprovisional application claims priority under 35 U.S.C. § 119(a) on Patent Application No(s). 2003-295958 filed in Japan on Aug. 20, 2003, the entire contents of which are hereby incorporated by reference.

BACKGROUND OF THE INVENTION

1. Field of the Invention

The present invention relates to a semiconductor integrated circuit, particularly to an art effectively applied to a semiconductor integrated circuit having a multilayer wiring structure.

2. Description of the Related Art

In the case of a semiconductor integrated circuit, a product is born which has a multilayer wiring structure constituted by forming a large-scale circuit device group on the surface of a semiconductor substrate and alternately heaping an insulating layer and a wiring layer to be electrically connected. Some of the semiconductor integrated circuits have a memory in which important confidential information is included or a circuit including an advanced intellectual property. Therefore, it may be preferable to take action so that information is not altered or analyzed.

Moreover, there is a problem that electromagnetic noises are radiated to the outside of a semiconductor integrated circuit to cause another semiconductor integrated circuit to malfunction depending on the amplitude of a clock signal or the like in the semiconductor integrated circuit and a hazard that the semiconductor integrated circuit malfunctions due to electromagnetic noises from another unit. Conventionally, to prevent the problems, the technique disclosed in Japanese Unexamined Publication No. 74771/1993 (prior art) has been used so far. In the case of the structure disclosed in the prior art, as shown in FIGS. 18 and 19, a multilayer wiring structure is used and a shielding film 1 is formed so as to cover almost the entire surface of a semiconductor integrated circuit by avoiding a terminal 2a for inputting or outputting signals.

However, as described above, by forming the shielding film 1 on almost the entire surface of the semiconductor chip, a problem occurs that a stress caused by a difference between thermal expansion coefficients of the shielding film 1 and an interlayer insulating film 7 or a difference between thermal expansion coefficients of the shielding film 1 and a semiconductor substrate 4 increases and a shift between the shielding film 1 and interlayer insulating film 7 increases or a warpage increases when the semiconductor chip is thin.

For example, in the case of an aluminum film used as a shielding film and a silicon nitride film used as an interlayer insulating film, the aluminum film used as the shielding film has a larger thermal expansion coefficient. Therefore, when passing through a heat treating step of a semiconductor fabrication process, the shielding film is more expanded than the interlayer insulating film. It is preferred that the expansion can be absorbed with the aluminum film. However, because the aluminum film covers almost the entire surface, thermal expansion cannot be absorbed, a convex warpage occurs which is formed when the central portion of a wafer protrudes, a shift occurs between the shielding film and interlayer insulating film, and resultantly a device malfunctions.

Moreover, there are some thin semiconductor devices of an IC card or the like, in which the thickness of a semiconductor chip to be mounted is less than 200 μm. In this case, for example, the thermal expansion coefficient of an aluminum film serving as a shielding film is larger than that of the single-crystalline silicon of a semiconductor substrate and therefore, a warpage occurs more remarkably.

Furthermore, when forming a plane not parallel with the surface of a semiconductor substrate on the back of the substrate as a countermeasure to prevent analysis by applying infrared radiation from the backside of the semiconductor substrate, a warpage occurs in which the central portion of the surface of the semiconductor substrate becomes convex. When covering the entire surface of the semiconductor substrate with a shielding film, the warpage becomes more remarkable. Therefore, it is difficult to use the shielding film for the entire surface.

SUMMARY OF THE INVENTION

The present invention is made to solve the above problems and its object is to provide a semiconductor integrated circuit and an IC card in which an analysis for an illegal purpose is impossible or very difficult while moderating a stress due to thermal expansion of a shielding layer.

To achieve the above object, a semiconductor integrated circuit of the present invention uses a semiconductor integrated circuit having a shielding film formed by a material different from at least either of the semiconductor substrate and the interlayer insulating film in thermal expansion coefficient, in which said shielding film has a shielding portion and an opening and at least either of a plurality of independent openings whose circumferences are surrounded by said shielding portion and a plurality of the independent shielding portions whose circumferences are surrounded by said opening are present and distributed on the entire surface of a chip. There are the first basic characteristics of the semiconductor integrated circuit of the present invention.

The semiconductor integrated circuit of the present invention uses the semiconductor integrated circuit having a shielding film formed by a material different from at least either of the semiconductor substrate and the interlayer insulating film in thermal expansion coefficient, in which said shielding film has the shielding portion and the opening and a plurality of the openings are present on an optional straight line parallel with the surface of the semiconductor substrate passing through a portion for shielding a circuit device and a circuit wiring in said shielding portion. There are the second basic characteristics of a semiconductor integrated circuit of the present invention.

In the case of the semiconductor integrated circuit of the present invention, more preferably, the length of the shielding portion present on the straight line is 200 μm or less in the above second basic characteristic.

In the case of the semiconductor integrated circuit of the present invention, still more preferably, the rate of the shielding portion occupying the area on the chip surface is 61% or less in any one of the above basic characteristics.

In the case of a semiconductor integrated circuit of the present invention, still more preferably, the rate of the shielding portion occupying the area on the chip surface is 40% or more in any one of the above basic characteristics.

According to each of the above semiconductor integrated circuits of the present invention, because a shielding film covers the entire surface of a chip at a certain shielding rate, even if unsealing the resin covering a semiconductor integrated circuit and exposing it to the surface of a semiconductor substrate, visual observation of a circuit device or circuit wiring from the outside of a chip or circuit analysis by a probe such as an electronic beam becomes very difficult. Particularly, by decreasing the width of an opening, physical probing or electromagnetically probing by an electronic beam becomes very difficult or impossible. It is preferable that the width of the opening is approx. 10 μm or less. In this case, it is allowed that the length of the opening is larger than the width of it. As a result, it is possible to effectively prevent the information in a semiconductor integrated circuit from being taken out for an illegal purpose.

Moreover, when a shielding film is made of a metal such as aluminum used for a metallic wiring layer, the above effect is remarkable. However, warpage of a wafer becomes a problem due to a difference between thermal expansion coefficients of a semiconductor substrate and an interlayer insulating film. Because boundary portions between openings of the shielding film, that is, between shielding portions and openings of the shielding film are uniformly scattered over the entire surface of a chip, even if the shielding film is expanded due to thermal treatment in the middle of the fabrication process of a semiconductor integrated circuit, the expansion can be absorbed at the boundary portions between shielding portions and openings over the entire surface of the chip. Therefore, it is possible to restrain the warpage of the wafer from occurring and the electrical characteristic of a device is not deteriorated.

Particularly, in the second basic characteristic, circuit devices and circuit wirings are generally scattered over the entire surface of a chip except chip ends when considering the effective use of a chip area. Therefore, optional straight lines passing through portions for shielding the circuit devices and circuit wirings are present over the entire surface of the chip and the fact that a plurality of openings are present on the straight lines guarantees that openings are uniformly scattered on the entire surface of the chip. Moreover, because these straight lines respectively have a plurality of openings, shielding portions do not have a long linear portion as a lump and the effect for moderating the stress due to thermal expansion absorption is securely guaranteed. Particularly, when the linear portions are securely restricted to 200 µm or less, the above stress moderation effect becomes remarkable.

Moreover, by restricting the rate of the shielding portions occupying the area on the chip surface to 61% or less, it is possible to secure 39% or more of the area of the openings uniformly scattered on the entire surface of the chip. Therefore, it is possible to securely demonstrate the above stress moderation effect. Furthermore, by securing 40% or more of the rate of the shielding portions occupying the area on the chip surface, it is possible to prevent the opening area from disproportionately becoming unnecessarily large, restrain the circuit shielding effect from being lost due to the shielding portions, and restrain the micro loading effect (phenomenon in which the etching rate of a fine pattern portion lowers compared to a large pattern portion) when etching a shielding film pattern, and moreover improve the uniformity of a chip thickness after polishing the back of a wafer (semiconductor substrate).

In the case of a semiconductor integrated circuit of the present invention, still more preferably, the shielding portions are formed by a conductive metallic material and at least a part of the shielding portions are electrically connected to a fixed potential in any one of the above basic characteristics.

In the case of the semiconductor integrated circuit of the present invention, still more preferably, the shielding portions of the shielding films are formed by a conductive metallic material, at least two layers of the shielding portions are present on the surface of the semiconductor substrate, at least a part of the shielding portions of each layer are electrically connected to a fixed potential, the shielding films other than the uppermost one are pattern-formed so that one or more independent shielding portions whose circumferences are surrounded by the openings are present.

According to each of the above semiconductor integrated circuits of the present invention, because the shielding portion is electrically floated, more effective electromagnetic shielding is possible and moreover it is possible to moderate electromagnetic radiation noises discharged from a semiconductor integrated circuit and the influence of electromagnetic noises from the outside. Furthermore, when using a shielding portion as a power supply line for supplying ground potential or power supply potential to be connected to the circuit device of a semiconductor integrated circuit, there are advantages that the power supply line can be omitted from a metallic wiring layer for circuit wiring and the area of a semiconductor chip can be decreased. Furthermore, because the power supply line can be extended over the entire surface of a chip without being restricted by other circuit wiring, it is possible to greatly reduce the wiring resistance component and induction component of the power supply line, retrain the fluctuation of the power supply potential, and expect the improvement of electrical characteristics.

Particularly, when a shielding film is formed by a conductive metallic material and at least two layers of shielding films are present on the surface of the semiconductor substrate, at least tow layer of the shielding films can be used as power supply lines having potentials different from each other and the contraction effect of the above chip area becomes more remarkable. Moreover, when using two or more layers of shielding films as power supply lines, it is necessary to communicate the potential of the upper power supply line to a metallic wiring layer lower than the lower-most shielding film. However, by using the independent shielding portions of shielding films other than the upper-most one as relay points of the potential, it is possible to supply fixed potentials of all shielding films to the circuit device. Particularly, by uniformly scattering independent shielding portions, it is possible to freely supply fixed potentials to all circuit devices. Moreover, the degree of freedom of the layout design of the circuit device portion is improved and improvement of electrical characteristics of a circuit can be resultantly expected.

In the case of a semiconductor integrated circuit of the present invention, still more preferably, two layers of the shielding films are present on the surface of the semiconductor substrate and the upper shielding film is pattern-formed so that the shielding portion shields the opening of the lower shielding film in any one of the above basic characteristics. Still more preferably, the upper shielding film is pattern-formed into a periodic pattern in which at least either of the independent opening whose circumference is surrounded by the shielding portion and the independent shielding portion whose circumference is surrounded by the opening are periodically alternately arranged in two directions orthogonal to each other and the lower shielding film is pattern-formed into a periodic pattern in which the periodic patterns are displaced in the two directions by the half of each repetitive pitch.

According to each of the above semiconductor integrated circuits of the present invention, it is possible to prevent an analysis for an illegal purpose only by one-layer shielding film pattern. However, it is possible to shield almost the entire surface of a semiconductor integrated circuit when a plurality of shielding films are overlapped each other, the analysis of the circuit device portion under the shielding films becomes more difficult, and the confidentiality is improved. In this case, it is not necessary that pattern shapes of shielding films of various layers are the same.

Moreover, by pattern-forming two layers of shielding films, it is possible not only to shield almost the entire surface of a semiconductor integrated circuit but also to omit the time for individually designing the pattern shape of a shielding film and shorten the time required for the pattern design of a shielding film.

In the case of a semiconductor integrated circuit of the present invention, still more preferably, a circuit portion is formed at the surface of the semiconductor substrate and a rough face for irregularly reflecting the infrared radiation incoming toward the surface of the semiconductor substrate is formed on the back of the semiconductor substrate in any one of the above basic characteristics.

In the case of a semiconductor integrated circuit of the present invention, still more preferably, the shielding film is formed on the surface and back of the semiconductor substrate at least one each in any one of the above basic characteristics.

In the case of a semiconductor integrated circuit of the present invention, still more preferably, the treatment for increasing a crystal defect density is applied to the back of the semiconductor substrate in any one of the above basic characteristics.

According to each of the above semiconductor integrated circuits of the present invention, it is possible to prevent analysis of a circuit device portion formed on the surface of a semiconductor substrate by applying infrared radiation from the back of the semiconductor substrate.

Particularly, in the case of a configuration in which a rough face for irregularly reflecting infrared radiation is formed on the back of a semiconductor substrate, it is possible to prevent observation from the back of a circuit device on the surface of the semiconductor substrate. Moreover, when forming a face not parallel with the surface of a semiconductor substrate on the back of the semiconductor substrate and using the face as the above rough face, a stress is applied to the semiconductor substrate and a convex warpage occurs on the semiconductor substrate. Moreover, when forming a shielding film on the entire surface of a chip as ever, a convex warpage becomes more remarkable. However, by pattern-forming the shielding film as described above, a stress due to a difference between thermal expansion coefficients of a shielding film and an interlayer insulating film is moderated, it is possible to form a rough face for irregularly reflecting infrared radiation on the back of the semiconductor substrate, and the effect for preventing observation from the back can be received.

Moreover, when a shielding film is also formed on the back of a semiconductor substrate the same as the surface of the semiconductor substrate, it is possible to prevent observation from the back of a circuit device on the surface of the semiconductor substrate by accelerating irregular reflection of infrared radiation incoming from the back of the semiconductor substrate. Furthermore, though a certain degree of a convex warpage occurs on the semiconductor substrate due to the shielding film formed on the surface of the semiconductor substrate, a certain degree of a concave warpage occurs due to the shielding film formed on the back of the semiconductor substrate. Therefore, bending stresses of the shielding films present on the both sides of the semiconductor substrate are offset and the warpage of the semiconductor substrate is moderated.

Furthermore, when a treatment for increasing a crystal defect density is applied to the back of a semiconductor substrate, the defect density on the back of the semiconductor substrate becomes larger than the crystal defect density of a normal non-defective wafer. Therefore, the infrared radiation incoming from the back of the semiconductor substrate is irregularly reflected by crystal defects in the semiconductor substrate and it is possible to prevent observation from the back of a circuit device on the surface of the semiconductor substrate.

To achieve the above object, an IC card of the present invention mounts a semiconductor integrated circuit of the present invention.

According to an IC card of the present invention, a semiconductor integrated circuit to be mounted demonstrates an effect by the semiconductor integrated circuit of the present invention. Therefore, resultantly, an IC card having the same effect is obtained in which analysis for an illegal purpose is impossible or very difficult.

DETAILED DESCRIPTION OF THE INVENTION (PREFERRED EMBODIMENTS)

Embodiments of a semiconductor integrated circuit of the present invention (hereafter referred to as "present invention circuit") are described below by referring to the accompanying drawings. In the case of symbols in drawings, the same portion of a structure disclosed in the prior art is provided with the same symbol.

<First Embodiment>

Figure 1:
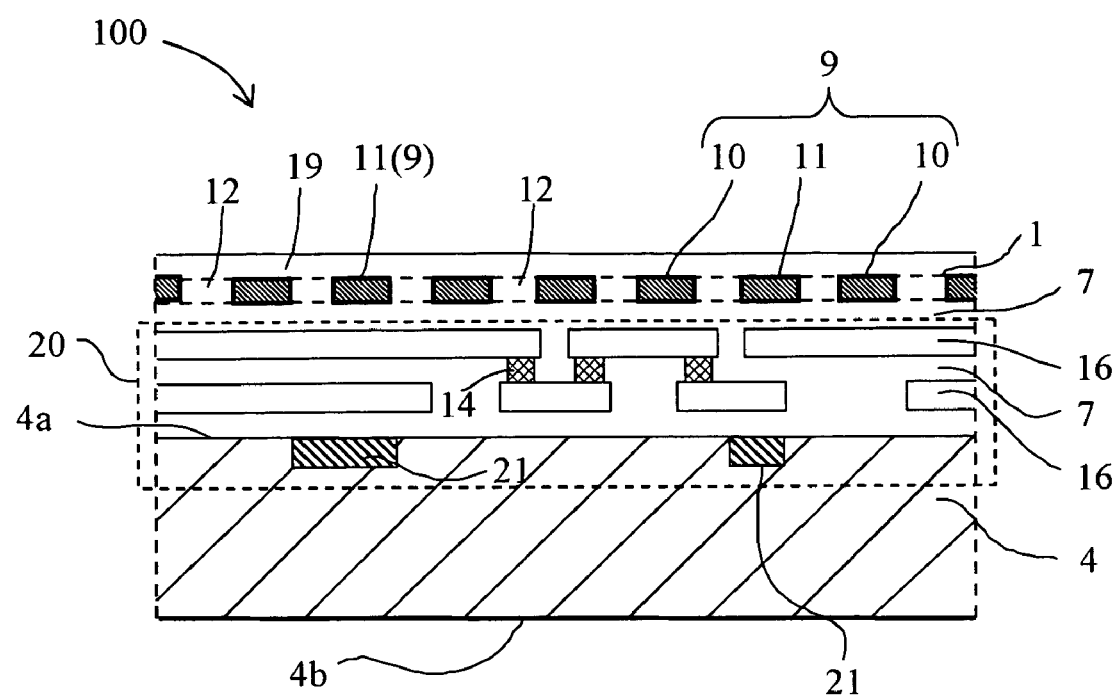
FIG. 1 is a local sectional view schematically showing a sectional structure of a first embodiment of a semiconductor integrated circuit of the present invention.

FIG. 1 schematically shows a sectional structure of a present invention circuit 100 of the first embodiment. As shown in FIG. 1, the present invention circuit 100 is formed by a circuit device 21 constituted by a MOSFET, diode, and resistance on the surface 4a of a semiconductor substrate 4 such as a single-crystalline silicon substrate by the normal semiconductor fabrication process and moreover forming a signal wiring between circuit devices 21 and a signal line for inputting/outputting a signal from or to the outside of the present invention circuit 100 by a metallic wiring 16. The metallic wiring 16 is formed on the upper portion than the circuit device 21 on the surface 4a of the semiconductor substrate 4 and moreover, the shielding film 1 according to the same metallic layer as the metallic wiring 16 is formed on the upper layer of a circuit structural portion 20 formed by the circuit device portion 21 and metallic wiring 16. The shielding film 1 has a shielding portion 9 and an opening 12 as described later. In the case of the example in FIG. 1, the metallic wiring 16 and the shielding portion 9 of the shielding film 1 are realized by using a three-layer metallic wiring process. However, the number of layers of metallic wirings is not restricted to 3 layers. Each metallic wiring 16 and shielding portion 9 are mutually electrically insulated by the interlayer insulating film 7. Each metallic wiring 16 is vertically electrically connected with the shielding portion 9 through a connection layer 14. Moreover, a protective film 19 is formed above the shielding film 1 and the opening 12 of the shielding film 1 to be described later is filled with the protective film 19.

In the case of this embodiment, the metallic wiring 16 for signal wiring and the shielding potion 9 of the shielding film 1 are formed by metallic materials of five layers of TiN, Ti, AlCu, TiN, and Ti from the upper side, the metallic wiring 16 has a film thickness of 0.535 µm and the shielding portion 9 has a film thickness of 0.76 µm. The interlayer insulating film 7 between metallic wirings 16 and between the metallic wirings 16 and shielding film 1 is formed by a P-TEOS/HDP film having a thickness of approx. 1 µm.

In the case of this embodiment, the shielding film 1 does not cover 100% of the entire surface of a chip with the above metallic material but form the opening 12 uniformly scattered on the entire surface of a chip and an action is taken to moderate a stress due to a difference between thermal expansion coefficients of the semiconductor substrate 4 and the interlayer insulating film 7 caused by heat treatment in the middle of the fabrication process (wafer stage) of the present invention circuit. That is, the portion other than the shielding portion 9 of the shielding film 1 serves as the opening 12. In this case, the opening 12 is formed on the basis of (1) scattering at least either of a plurality of independent openings 12a whose circumference is surrounded by the shielding portion 9 and a plurality of independent shielding portion 11 whose circumference is surrounded by the opening 12 in the shielding portion 9 on the entire surface of a chip or on the basis of (2) on the basis that a plurality of openings 12 are present on an optional straight line (temporarily referred to as "determination straight line") parallel with the surface of the semiconductor substrate 4 passing through a portion for shielding the circuit device portion 21 and the circuit wiring in the shielding portion 9. In this case, (2) denotes that a plurality of openings 12 uniformly distributed on the entire surface of a chip are realized by assuming not a straight line crossing only a chip corner portion but a straight line crossing the central portion of the chip because the openings 12 are present on the determination straight line. Moreover, in the case of this embodiment, the openings 12 are formed so that the length of the portion where the determination straight line in the above (2) is superimposed on the shielding portion 9 does not exceed 200 µm and the rate of an area on the entire surface of the chip occupied by the shielding portion 9 (shielding rate) ranges between 40% and 61%, more preferably between 50% and 60%.

Figure 2:
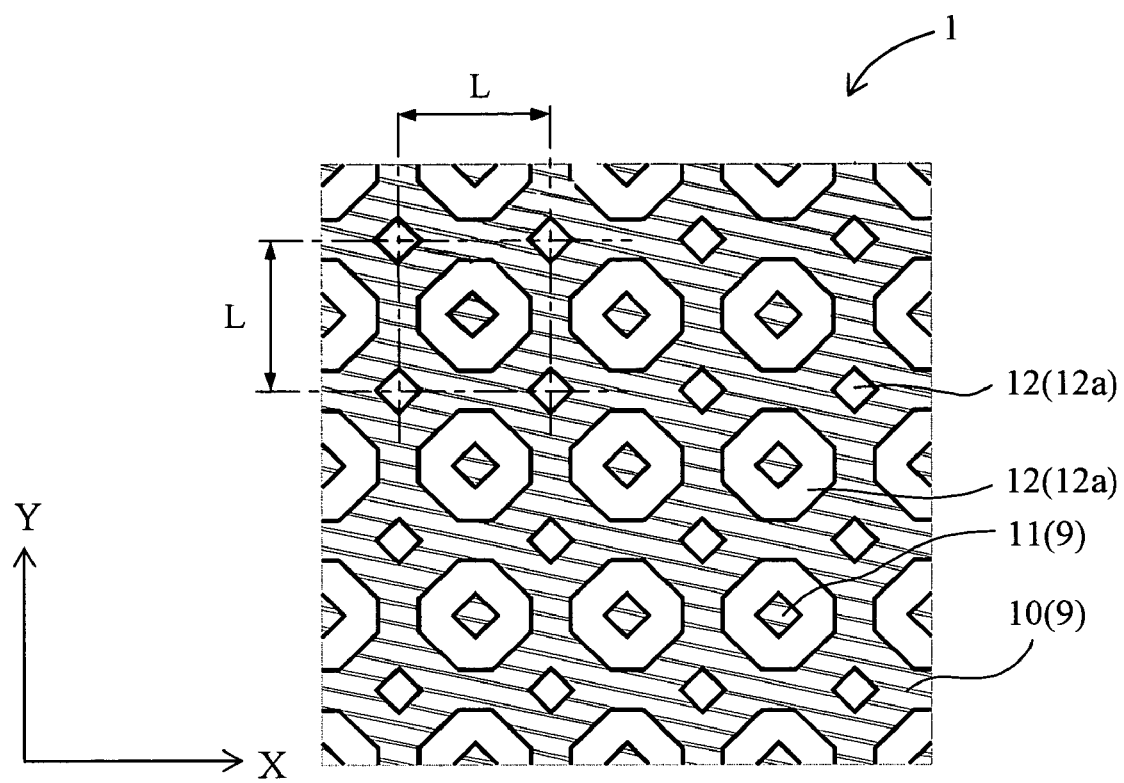
FIG. 2 is a local top view showing a shielding film pattern of the first embodiment of the semiconductor integrated circuit of the present invention.
Figure 3:
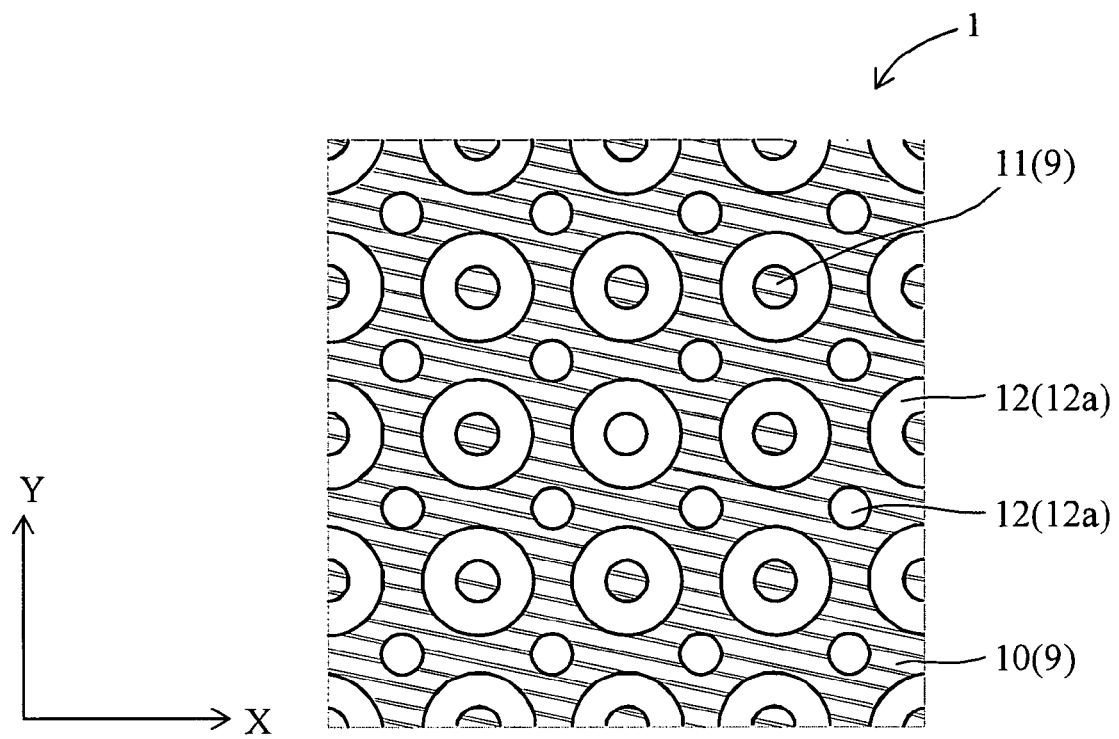
FIG. 3 is a local top view showing another shielding film pattern of the first embodiment of the semiconductor integrated circuit of the present invention.

FIGS. 2 and 3 show specific patterns (portions) of the shielding film 1. In the case of the shielding film pattern shown in FIG. 2, the shielding portion 9 and opening 12 are alternately repeated on straight lines in X direction, Y direction, and diagonal direction in order of the continuous shielding portion 10 with which the shielding portion 9 continuously contacts, opening 12, independent shielding portion 11 whose circumference is surrounded by the opening 12, and opening 12. In the case of the pattern in FIG. 2, all the openings 12 are independent openings 12a whose circumferences are surrounded by the shielding portions 9 (continuous shielding portion 10 and independent shielding portion 11). In the case of the shielding film pattern shown in FIG. 2, the opening 12 is alternately repeated in X direction and Y direction at a repetitive pitch L (e.g. 40 µm). The rhombic opening 12 and the independent shielding portion 11 have the same size and the length of a diagonal line is 10 µm. The circular opening 12 is formed around the independent shielding portion 11. Therefore, in the case of the shielding film pattern shown in FIG. 2, the maximum length of the superimposed portion between the determination straight line and the shielding portion 9 is 200 µm or less at approx. 43 µm and the shielding rate is 56.25%.

The pattern shown in FIG. 3 is a modification of the pattern shown in FIG. 2, which is changed by forming a rectangle or octagon into a circle. The repetitive pitch L is the same in FIG. 2 and FIG. 3. Thus, by forming the linear factor of the opening 12 into a curved line, stress concentration at the corner portion where a straight line and a straight line are crossed can be moderated and a crack does not easily occur on the shielding film 1. In the case of the shielding film pattern shown in FIG. 3, the maximum length of the superimposed portion between the determination straight line and shielding portion 9 is approx. 57 µm and the shielding rate is 60.76%.

The shielding film 1 shows the original shielding effect while the shielding portion 9 is electrically floating. However, it is more preferable to electrically connect the continuous shielding portion 10 of the shielding portion 9 to a fixed potential such as the ground potential or a power supply potential used for the circuit device portion 21 of the present invention circuit. As a result, the shielding effect for preventing a malfunction due to influences of radiation of electromagnetic noises and noises sent from others is more shown.

Figure 4:
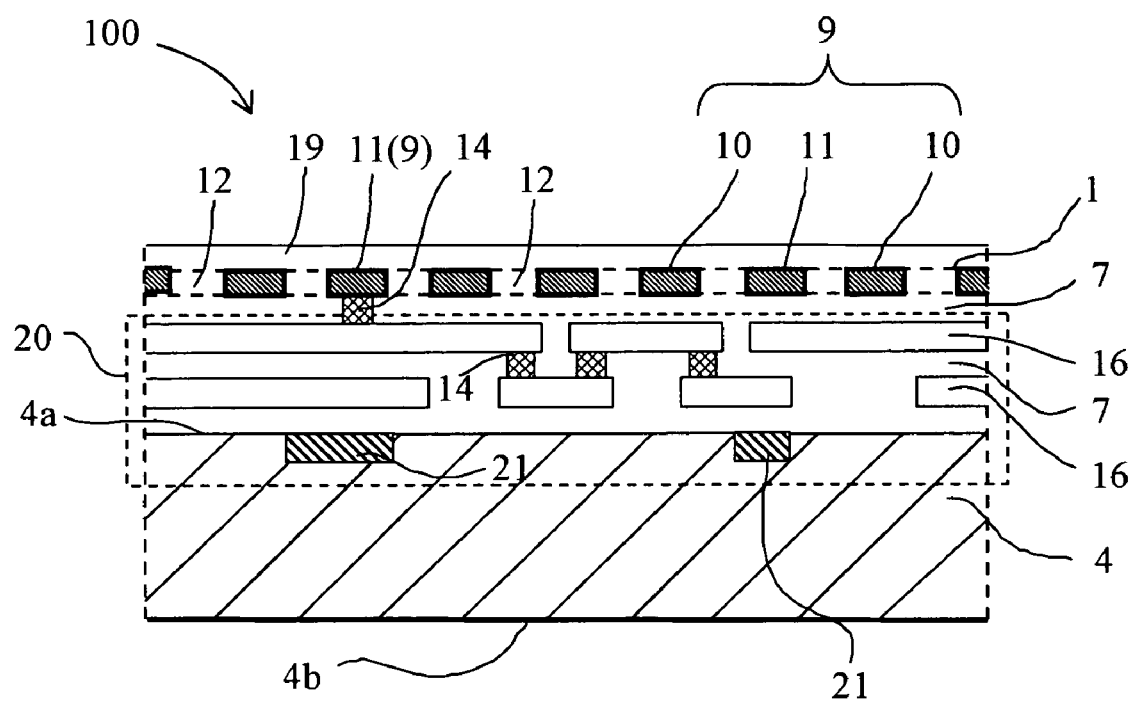
FIG. 4 is a sectional view schematically showing another sectional structure of the first embodiment of the semiconductor integrated circuit of the present invention.

Moreover, as shown in FIG. 4, by using the shielding portion 9 of the shielding film 1 as a power supply wiring for supplying the ground potential or power supply potential, extension of the power supply wiring by the metallic wiring 16 becomes unnecessary addition to said shielding effect and it is possible to reduce power supply noises by decreasing the resistance and inductance of the power supply wiring and decrease a chip size. In the case of FIG. 4, the ground potential or power supply potential is successively supplied from the shielding portion 9 to lower metallic wiring 16 through the connection layer 14 and finally supplied to the circuit device portion 21. The continuous shielding portion 10 corresponds to a portion used as the power supply wiring of the shielding portion 9 in the shielding film pattern shown in FIG. 2 or FIG. 3.

(Second Embodiment)

Figure 5:
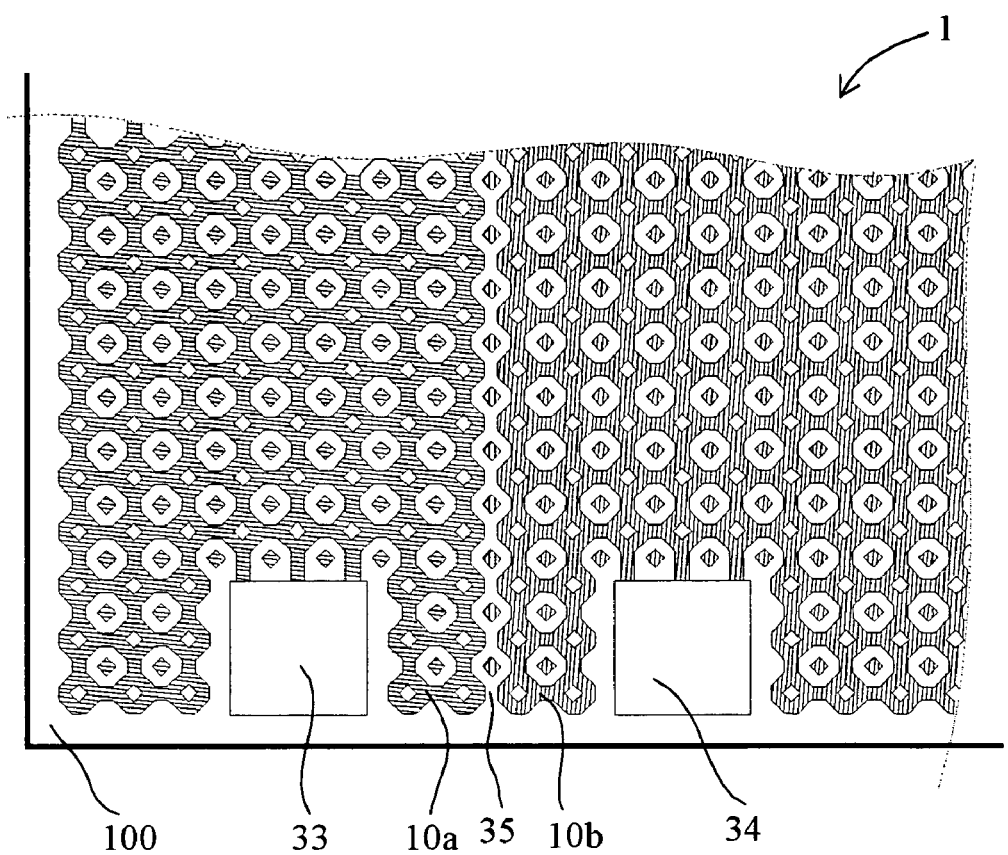
FIG. 5 is a local top view showing a shielding film pattern and a top-viewed structure of a second embodiment of a semiconductor integrated circuit of the present invention.

FIG. 5 shows a pattern (portion) and a top viewed structure of the shielding film 1 of the present invention circuit 100 of the second embodiment. The sectional structure of the present invention circuit 100 is the same as the first embodiment. The difference from the first embodiment is the pattern shape of the shielding film 1. In the case of the shielding film pattern of the first embodiment, the opening 12 and independent shielding portion 11 are formed in one large continuous shielding portion 10. In the case of the second embodiment, however, the continuous shielding portion 10 is divided into two continuous shielding portions 10a and 10b by an isolating space 35. Thus, when a plurality of continuous shielding portions 10 are present by being electrically isolated, it is possible to use the continuous shielding portions 10a and 10b as power supply wirings having potential levels different from each other. In this case, by connecting the continuous shielding portions 10a and 10b with power supply pads 33 and 34 having different potentials respectively, it is possible to use them as a plurality of power supply wirings while providing the shielding effect for preventing a malfunction due to the shielding effect and radiation of electromagnetic noises and influence of noises from others to the shielding portions 10a and 10b. It is allowed that the power supply pads 33 and 34 have the same potential (e.g. ground potential). In any case, the continuous shielding portions 10a and 10b are connected to a fixed potential to show the above shielding effect.

Figure 6:
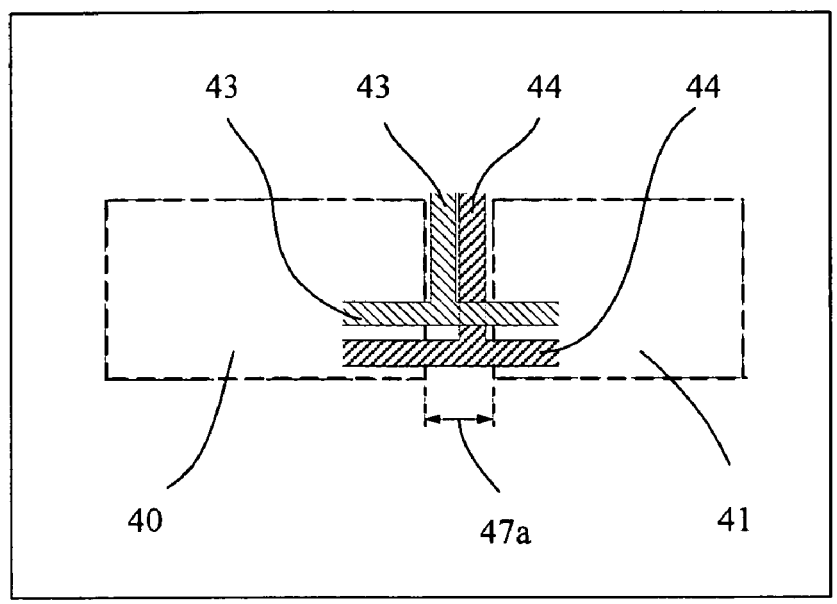
FIG. 6 is a local top view schematically showing a top-viewed structure of a conventional semiconductor integrated circuit.
Figure 7:
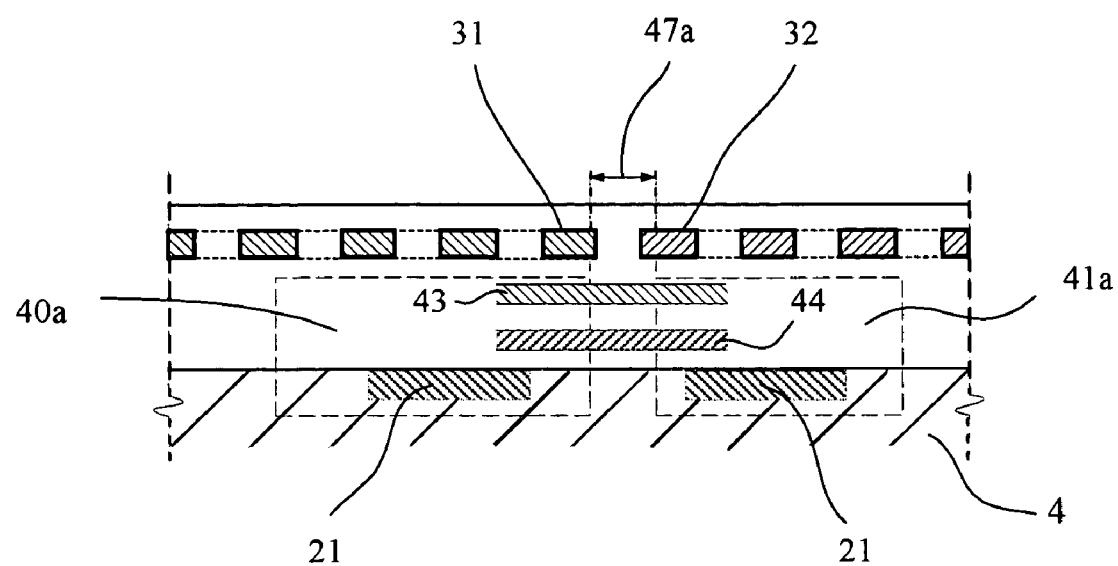
FIG. 7 is a local sectional view schematically showing a sectional structure of a semiconductor integrated circuit of the present invention.

Conventionally, as schematically shown by the top view in FIG. 6 or the sectional view in FIG. 7, first power supply line 43 and a second power supply line 44 are necessary for a first circuit block 40 and a second circuit block 41 and wiring spaces of the power supply lines 43 and 44 are necessary for the surrounding area of the first circuit block 40 and second circuit block 41 or a space 47a between the first and second circuit blocks.

Figure 8:
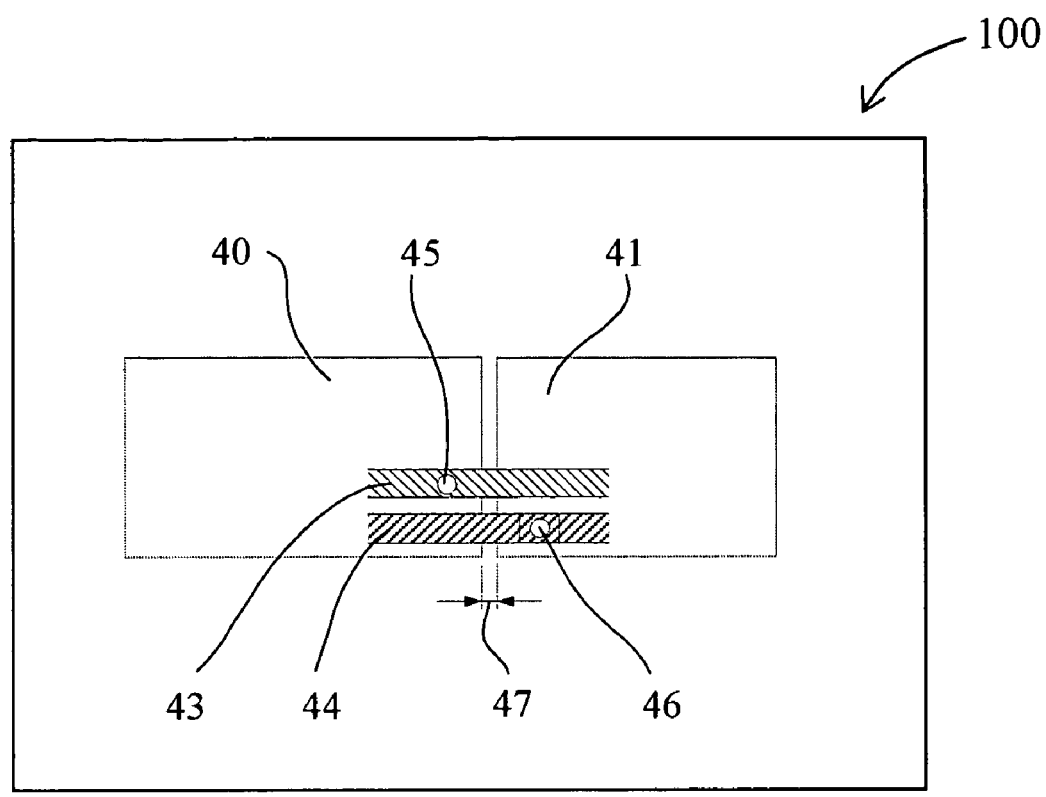
FIG. 8 is a local top view schematically showing a top viewed structure of the second embodiment of the semiconductor integrated circuit of the present invention.
Figure 9:
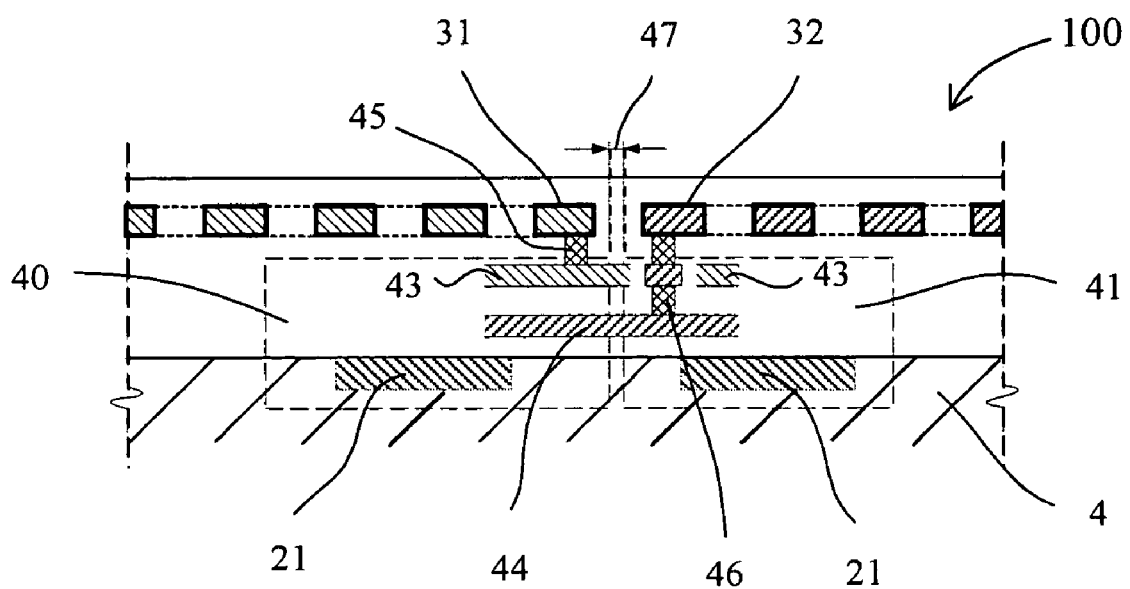
FIG. 9 is a local sectional view schematically showing a sectional structure of the second embodiment of the semiconductor integrated circuit of the present invention.

However, when using the shielding portion 9 as a power supply line like this embodiment, the first continuous shielding portion 10a is connected to the first circuit block 40 and second circuit block 41 through a first connection layer 45 as shown by the sectional view in FIG. 9. Moreover, the second continuous shielding portion 10b is connected to the first circuit block 40 and second circuit block 41 through a second connection layer 46. Thereby, it is possible to omit extension of the first and second power supply wirings respectively using a metallic wiring on the same layer as a signal wiring set at the surrounding area of the first circuit block 40 and second circuit block 41 and make a space 47 between the first circuit block 40 and second circuit block 41 smaller than the space 47a between the conventional circuit blocks as shown in FIGS. 8 and 9. As a result, it is possible to decrease the chip size of the present invention circuit. The content is particularly effective for a semiconductor integrated circuit requiring multiple power supply. It is possible to use the shielding portion 9 as a power supply line even when power is supplied from the outside through a power supply pad or from an internal circuit (for example, regulator output).

(Third Embodiment)

Figure 10:
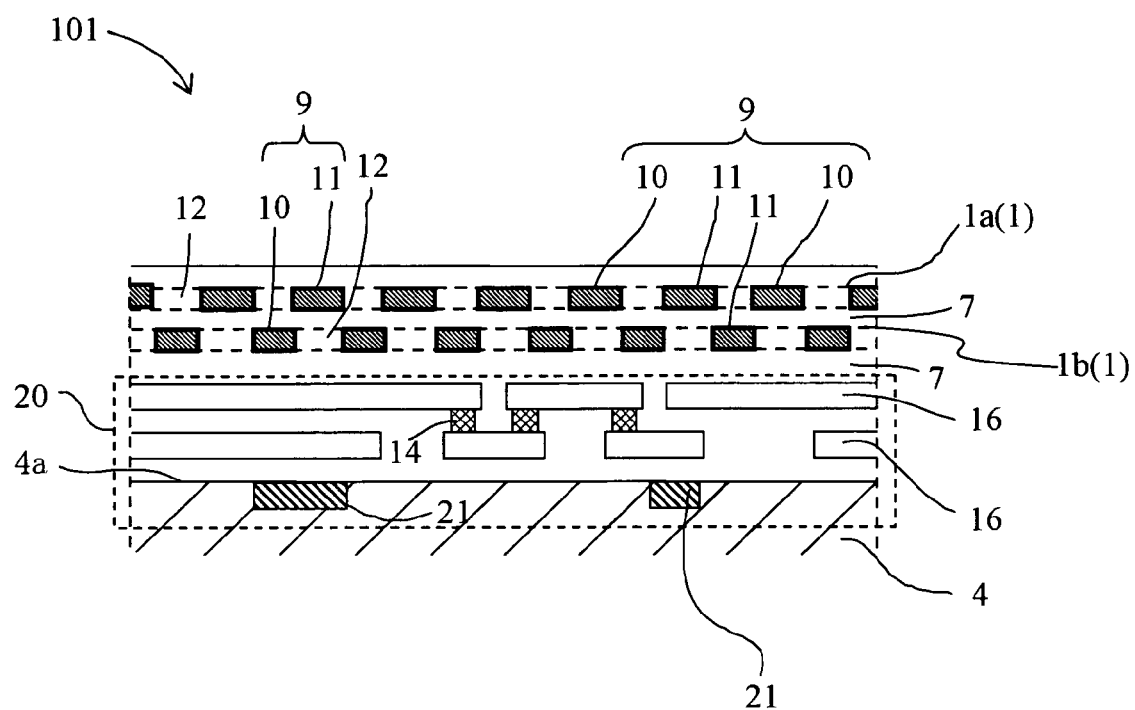
FIG. 10 is a local sectional view schematically showing a sectional structure of a third embodiment of a semiconductor integrated circuit of the present invention.

FIG. 10 schematically shows a sectional structure of a present invention circuit 101 of third embodiment. The present invention circuit 101 is different from the present invention circuit 100 in that shielding films 1 are constituted by two layers and have a upper shielding film 1a and a lower shielding film 1b. How to form a circuit device portion 21, signal wiring, shielding films 1a and 1b, and interlayer insulating film 7 and a material used and film thickness are the same as the case of the first embodiment. However, the lower shielding film 1b has the same thickness as the metallic wiring 16.

In the case of the third embodiment, it is possible to completely shield a circuit structure portion 20 by using two layers of the shielding film 1 of the upper shielding film 1a and the lower shielding film 1b and prevent the circuit structure portion 20 from optical observation by an optical microscope or observation by an electronic beam tester. Each of two layers of the shielding films 1 is provided with openings 12 uniformly scattered on the entire surface of a chip in order to apply a stress moderation measure similarly to the case of the first embodiment and the reference for forming the openings 12 is basically the same as that described for the first embodiment.

Figure 11:
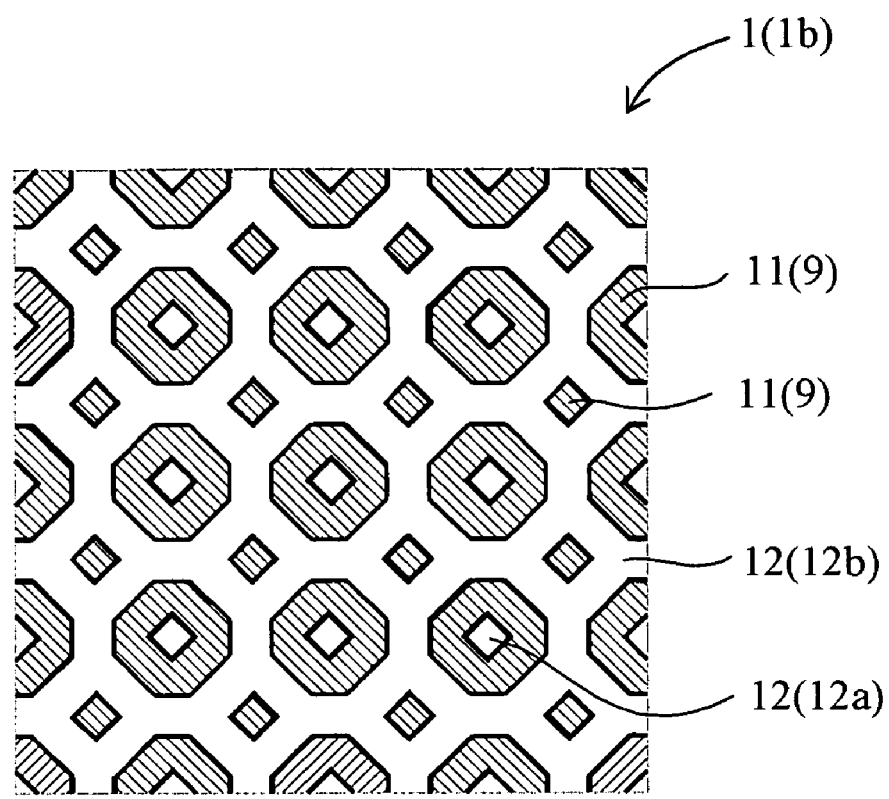
FIG. 11 is a local top view showing a shielding film pattern of a lower shielding film of the third embodiment of the semiconductor integrated circuit of the present invention.

It is allowed to use the pattern of the shielding film 1 of the first embodiment shown in FIGS. 2 and 3 as the shielding film pattern of the upper shielding film 1a. It is allowed to use the pattern as the shielding film pattern of the lower shielding film 1b so that the circuit structure portion 20 cannot be observed through two layers of the upper shielding film 1a and the lower shielding film 1b. For example, when using the shielding film pattern in FIG. 2 as the shielding film pattern of the upper shielding film 1a, it is allowed to use the shielding film pattern shown in FIG. 11 as the shielding film pattern of the lower shielding film 1b. The shielding film pattern shown in FIG. 11 is a reverse pattern of the shielding film pattern in FIG. 2. That is, the opening 12 of the upper shielding film 1a is located on the shielding portion 9 of the lower shielding film 1b, the shielding portion 9 of the upper shielding film 1a is located on the opening 12 of the lower shielding film 1b, the relation between the both is complementary, and a repetitive pitch L is the same for the upper shielding film 1a and the lower shielding film 1b in X direction and Y direction. In the case of the shielding film pattern shown in FIG. 11, the maximum length of the superimposed portion between a determination straight line and the lower shielding film 1b is approx. 29 μm and the shielding rate is 43.75%. A percentage of 100% is obtained by adding the shielding rate of the upper shielding film 1a with that of the lower shielding film 1b.

Figure 12:
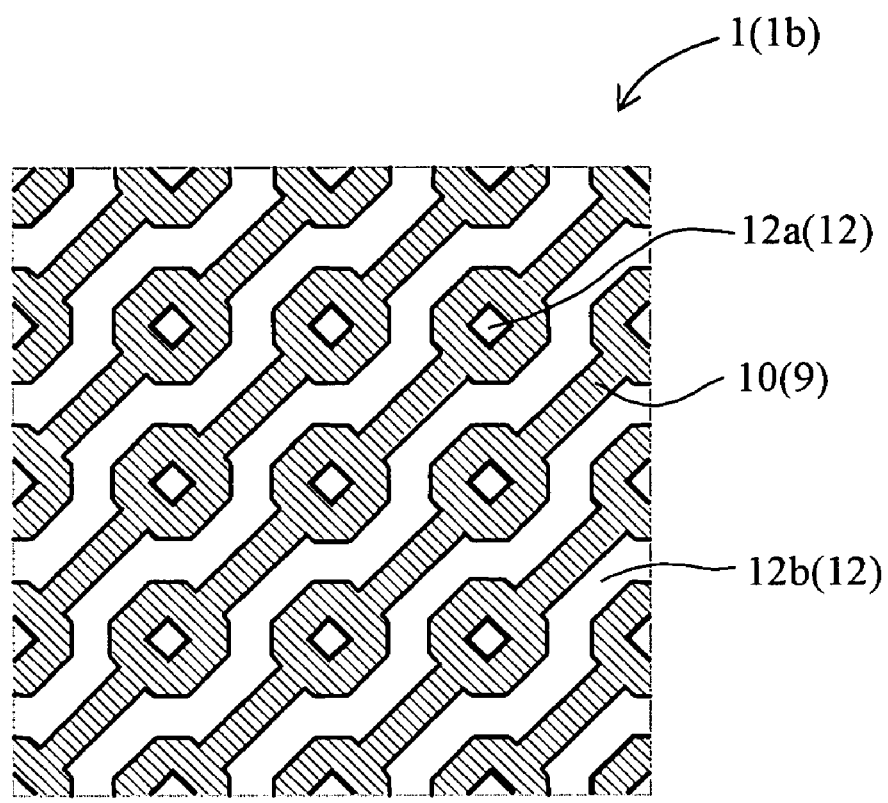
FIG. 12 is a local top view showing another shielding film pattern of the lower shielding film of the third embodiment of the semiconductor integrated circuit of the present invention.

Because all the shielding film patterns shown in FIG. 11 are constituted by an independent shielding portion 11 whose circumference is surrounded by the openings 12, as shown in the first embodiment, it is not possible to connect the shielding portion 9 of the lower shielding film 1b to a fixed potential or use the portion 9 as a power supply wiring. Moreover, not all the openings 12 of the shielding film pattern sown in FIG. 11 are independent openings 12a but they are mainly continuous openings 12b in which the openings 12 are continuously connected. Therefore, it is preferable to form the lower shielding film 1b into a shielding film pattern constituted by the continuous shielding portion 10 shown in FIG. 12. In the case of the shielding film pattern shown in FIG. 12, the maximum length of the superimposed portion between a determination straight line and the shielding portion 9 of the lower shielding film 1b is approx. 50 μm and the shielding rate is 53.12%. In the case of the shielding film pattern shown in FIG. 12, though not illustrated, by zigzag connecting continuous shielding portions 10 at ends, it is possible to form one or more continuous shielding portions 10 which are preferably used as a power supply wiring or power supply wirings.

Moreover, it is allowed to use the shielding film pattern of the upper shielding film 1a in FIG. 2 or 3 shifted by L/2 in X direction and Y direction respectively as a shielding film pattern of the lower shielding film 1b. In the case of the example in FIG. 2, the rhombic independent opening 12a on the shielding film pattern of the upper shielding film 1a just overlaps the rhombic independent shielding portion 11 of the shielding film pattern of the lower shielding film 1b, the annular independent opening 12a on the shielding film pattern of the upper shielding film 1a overlaps the continuous shielding portion 10 of the shielding film pattern of the lower shielding film 1b, and a shielding rate of 100% is realized by the upper shielding film 1a and the lower shielding film 1b. Thus, because the same shielding pattern can be used by the upper shielding film 1a and the lower shielding film 1b, the time required for design of a new shielding film pattern is unnecessary and a circuit design time can be decreased.

(Fourth Embodiment)

Figure 13:
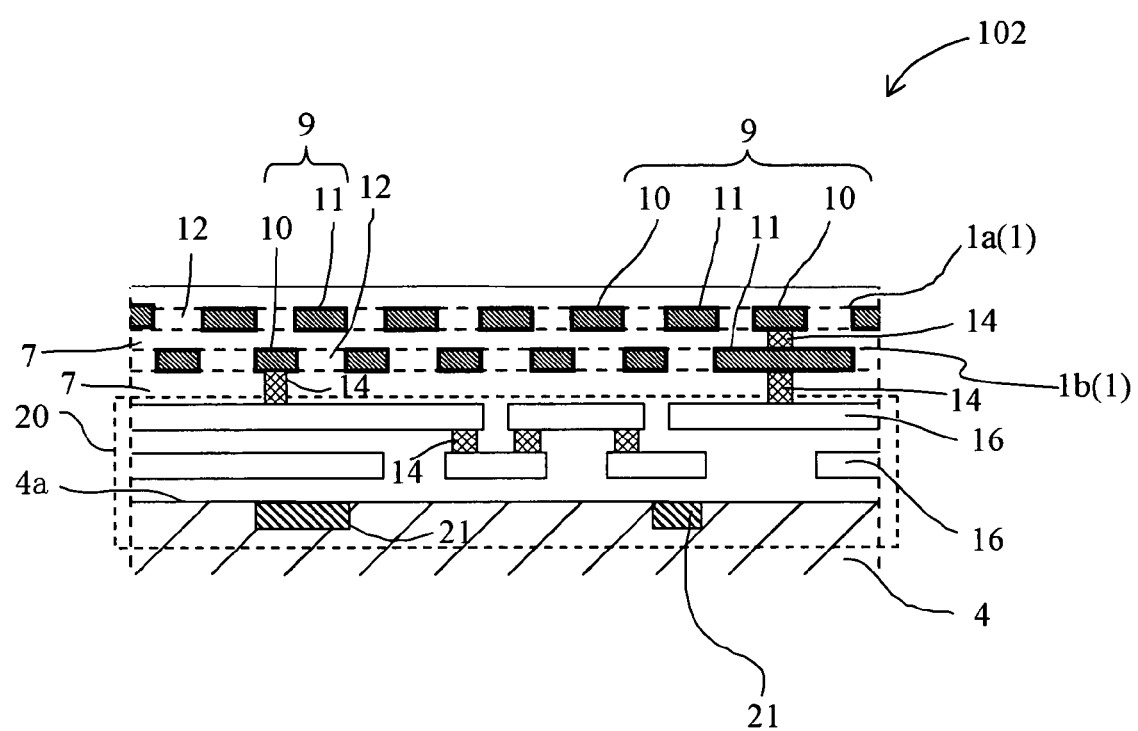
FIG. 13 is a local sectional view schematically showing a sectional structure of a fourth embodiment of a semiconductor integrated circuit of the present invention.

FIG. 13 schematically shows a sectional structure of a present invention circuit 102 of fourth embodiment. The present invention circuit 102 of the fourth embodiment is different from the present invention circuit 101 of the third embodiment in that shielding portions of the upper shielding film 1a and a lower shielding film 1b are used as power supply wirings. Continuous shielding portions 10 of the upper shielding film 1a and the lower shielding film 1b are electrically connected with the metallic wiring 16 of a circuit structure portion 20 through a connection layer 14. To connect the continuous shielding portion 10 of the upper shielding film 1a to the metallic wiring 16, the portion 10 is temporarily electrically connected with the independent shielding portion 11 of the lower shielding film 1b through the connection layer 14 and the independent shielding portion 11 of the lower shielding film 1b is connected to the metallic wiring 16 through the connection layer 14. Therefore, two types of shielding portions such as the continuous shielding portion 10 used as a power supply wiring and the independent shielding portion 11 for relay are necessary for the shielding film pattern of the lower shielding film 1b and it is necessary that the both shielding portions 10 and 11 are electrically isolated from each other.

(Fifth Embodiment)

Figure 14:
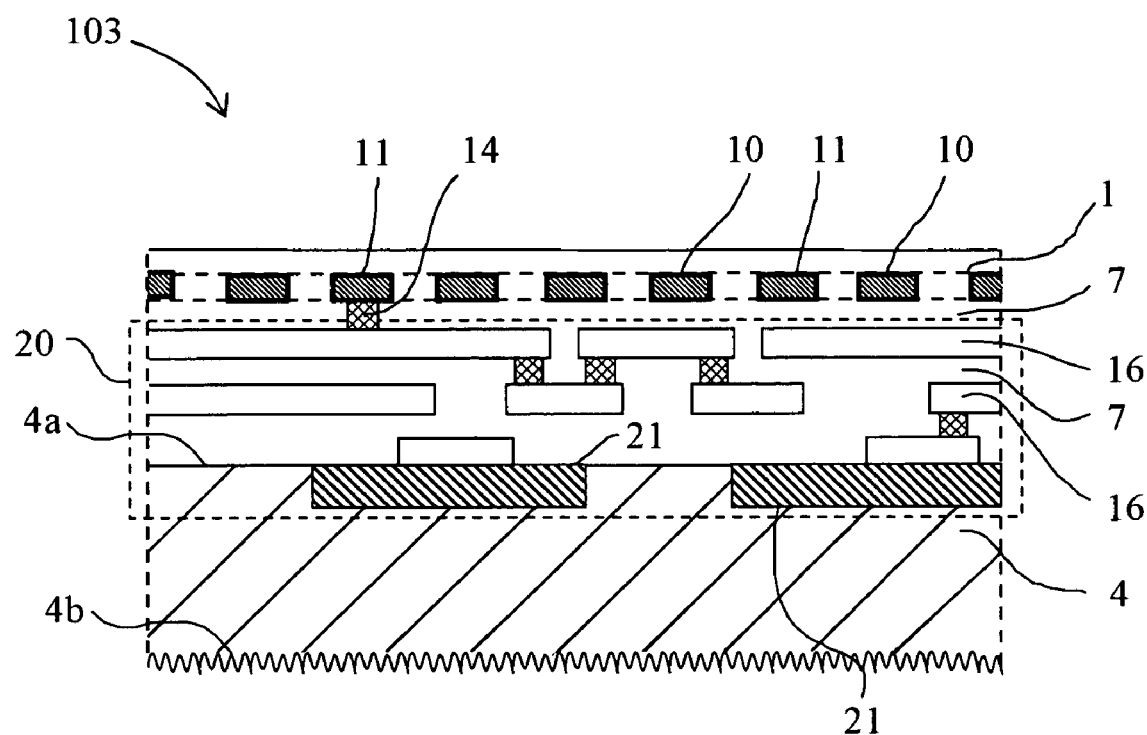
FIG. 14 is a local sectional view schematically showing a sectional structure of a fifth embodiment of a semiconductor integrated circuit of the present invention.

FIG. 14 schematically shows a sectional structure of a present invention circuit 103 of the fifth embodiment. FIG. 14 illustrates a case in which a shielding film 1 is formed by one layer. However, it is allowed that the shielding film 1 is formed by two or more layers. The fifth embodiment is different from the first to fourth embodiments in that a rough face for irregularly reflecting infrared radiation supplied toward the surface 4a of a semiconductor substrate 4 from the back 4b of the semiconductor substrate 4 is formed on the back 4b of the semiconductor substrate 4. Therefore, the configuration of the surface 4a of the semiconductor substrate 4 is the same as the case of any one of the first to fourth embodiments.

After any one of the present invention circuits 100 to 102 of the first to fourth embodiments is formed at the wafer stage, the wafer-state present invention circuits 100 to 102 are cut into chips. Thereafter, the semiconductor substrate 4 is polished from the back 4b so that the thickness of the chip-state present invention circuits 100 to 102 becomes less than 200 μm. At the time of the polishing, a rough face constituted by a face non-parallel with the surface 4a of the semiconductor substrate 4 is formed as shown in FIG. 14. The rough face is formed by any one of grinding methods such as grinding through dicing, grinding through sand blast, grinding through sand paper, and grinding through laser beam. Thereby, it is possible to prevent observation of the circuit structure portion 20 on the surface 4a of the semiconductor substrate 4 for an illegal purpose performed by receiving infrared radiation from the back 4b of the semiconductor substrate 4.

(Sixth Embodiment)

Figure 15:
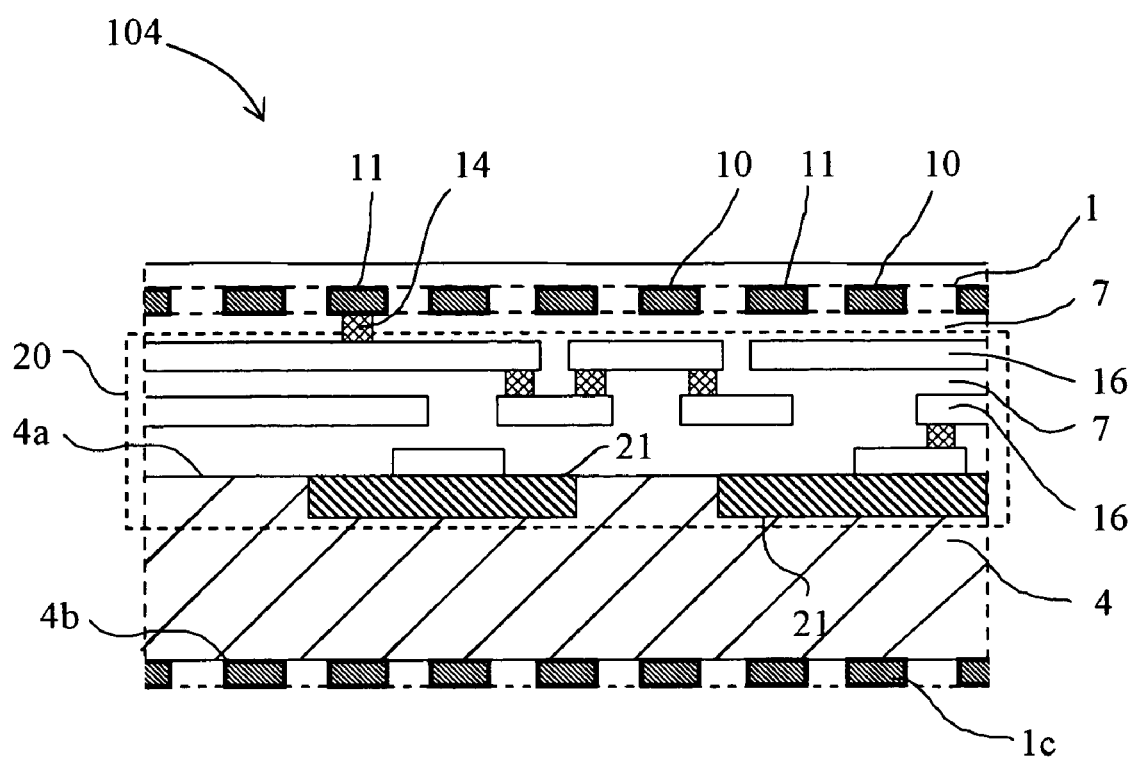
FIG. 15 is a local sectional view schematically showing a sectional structure of a sixth embodiment of a semiconductor integrated circuit of the present invention.

FIG. 15 schematically shows a sectional structure of a present invention circuit 104 of sixth embodiment. Though FIG. 15 shows a case in which a shielding film 1 is formed by one layer, it is allowed that the shielding film 1 is formed by two or more layers. The sixth embodiment is different from the first to fourth embodiments in that a back shielding film 1c is formed on the back 4b of a semiconductor substrate 4. Therefore, the configuration of the surface 4a of the semiconductor substrate 4 is the same as the case of any one of the first to fourth embodiments.

It is allowed to use a film same as the pattern of the shielding film 1 of the first to fourth embodiments as the shielding film pattern of the back shielding film 1c. After polishing the back 4b of the semiconductor substrate 4, the back shielding film 1c is deposited and pattern-formed. Thereby, it is possible to prevent observation of a circuit structure portion 20 on the surface 4a of the semiconductor substrate 4 for an illegal purpose performed by supplying infrared radiation from the back 4b of the semiconductor substrate 4 in addition to the shielding effect on the surface 4a of the semiconductor substrate 4. Moreover, in the case of the semiconductor substrate 4, a warpage convex upward occurs at the central portion of a wafer to a certain extent due to a difference between thermal expansion coefficients of the shielding film 1 formed on the surface 4a of the semiconductor substrate 4 and the semiconductor substrate 4. However, by forming the back shielding film 1c on the back 4b of the semiconductor substrate 4, a concave warpage occurs on the semiconductor substrate 4 due to a difference between thermal expansion coefficients of the back shielding film 1c and the semiconductor substrate 4. Thereby, the bending stress working on a wafer is offset and the warpage of the semiconductor substrate 4 is moderated.

(Seventh Embodiment)

Figure 16:
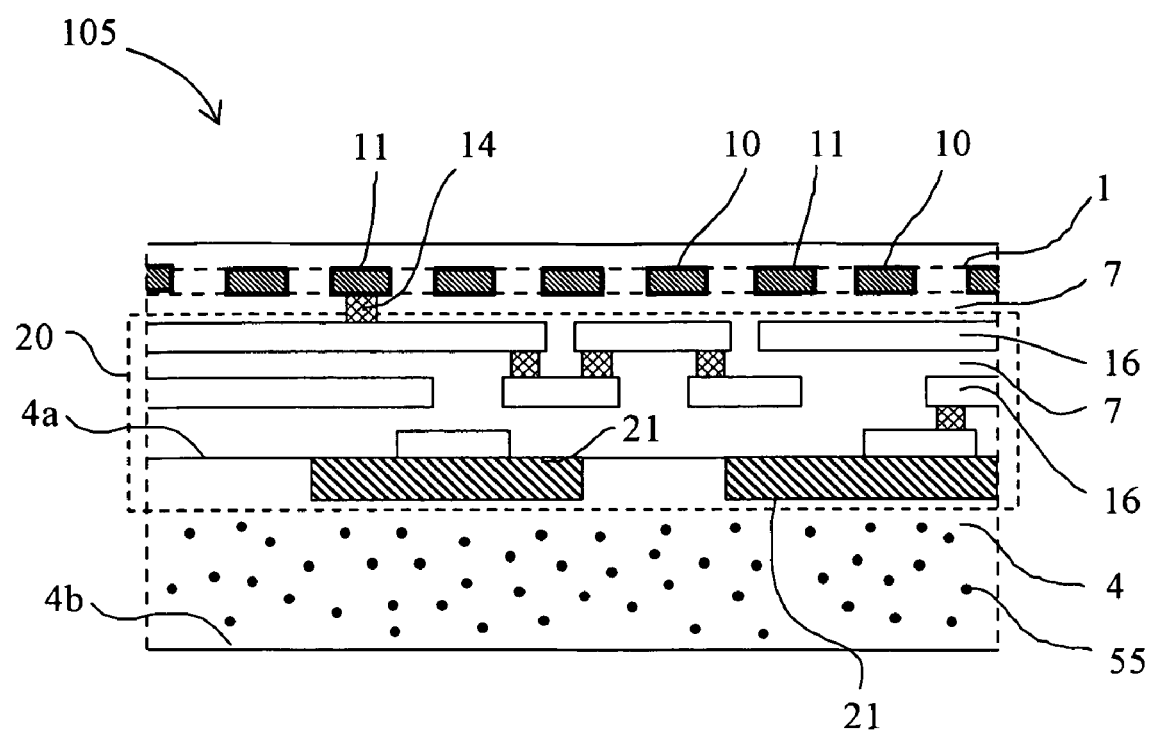
FIG. 16 is a local sectional view schematically showing a sectional structure of a seventh embodiment of a semiconductor integrated circuit of the present invention.

FIG. 16 schematically shows a sectional structure of a present invention circuit 105 of seventh embodiment. FIG. 16 illustrates a case in which a shielding film 1 is formed by one layer. However, it is allowed that the shielding film 1 is formed by two or more layers. The seventh embodiment is different from the first to fourth embodiments in that a treatment for increasing a crystal defect density is applied to a region not reaching a circuit device potion 21 on the back 4b of a semiconductor substrate 4 and the crystal defect density is larger than the crystal defect density of a normal non-defect semiconductor substrate. Therefore, the configuration on the surface 4a of the semiconductor substrate 4 is the same as the case of any one of the configurations of the first to fourth embodiments.

After any one of the present invention circuits 100 to 102 of the first to fourth embodiments is formed at the wafer stage, argon gas is made to contact with only the back 4b of the semiconductor substrate 4. In this case, by performing a high-temperature heat treatment (e.g. heat treatment at 750° C. for 168 hr), it is possible to artificially generate a crystal defect 55 (e.g. defect having a defect density higher than $10^{13}/cm^3$) and irregularly reflect infrared radiation incoming from the back 4b by the generated crystal defect 55. As a result, it is possible to prevent observation of a circuit structure portion 20 on the surface 4a of the semiconductor substrate 4 for an illegal purpose performed by applying infrared radiation from the back 4b of the semiconductor substrate 4 in addition to the shielding effect on the surface 4a of the semiconductor substrate 4.

As described above, for the present invention circuits 100 to 102 of the first to fourth embodiments, it is allowed to individually apply any one of infrared radiation incoming measures on the backs 4b of the semiconductor substrates 4 of the fifth to seventh embodiments, it is also allowed to combine and apply these measures optionally.

(Eighth Embodiment)

Figure 17:
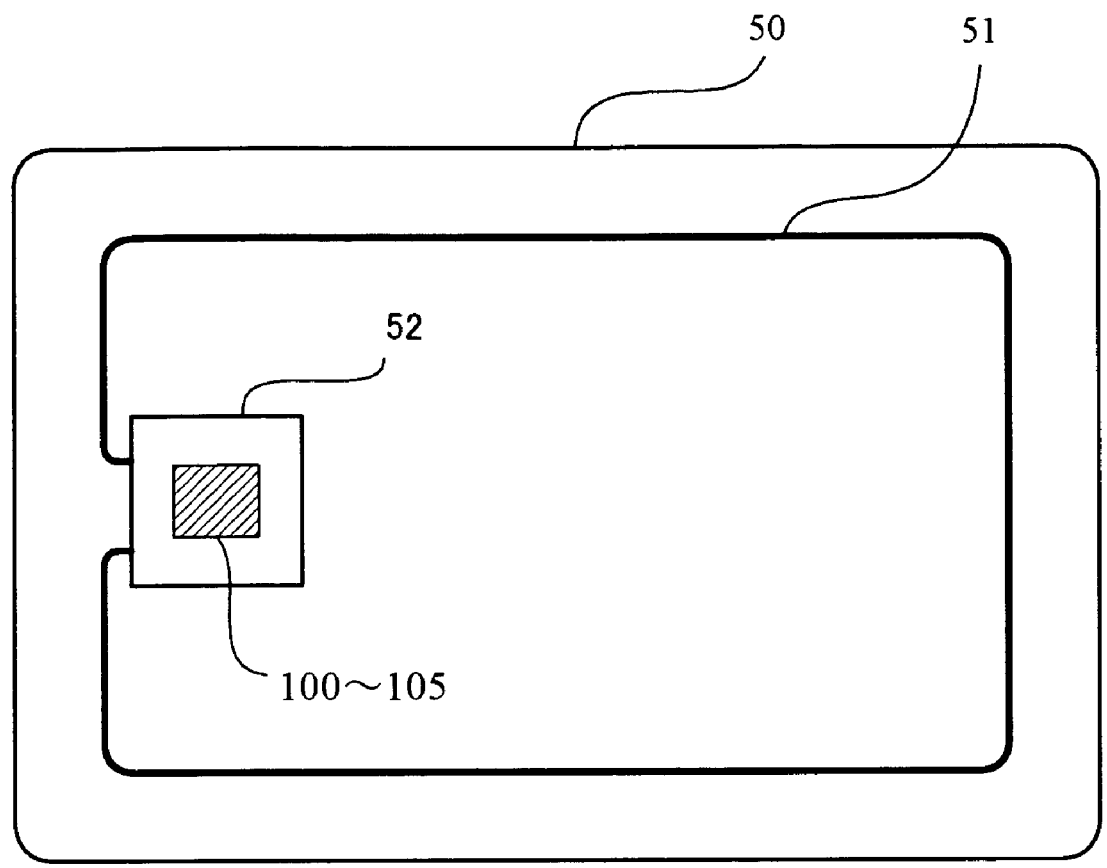
FIG. 17 is a local top view schematically showing a top-viewed configuration of an embodiment of an IC card of the present invention.
Figure 18:
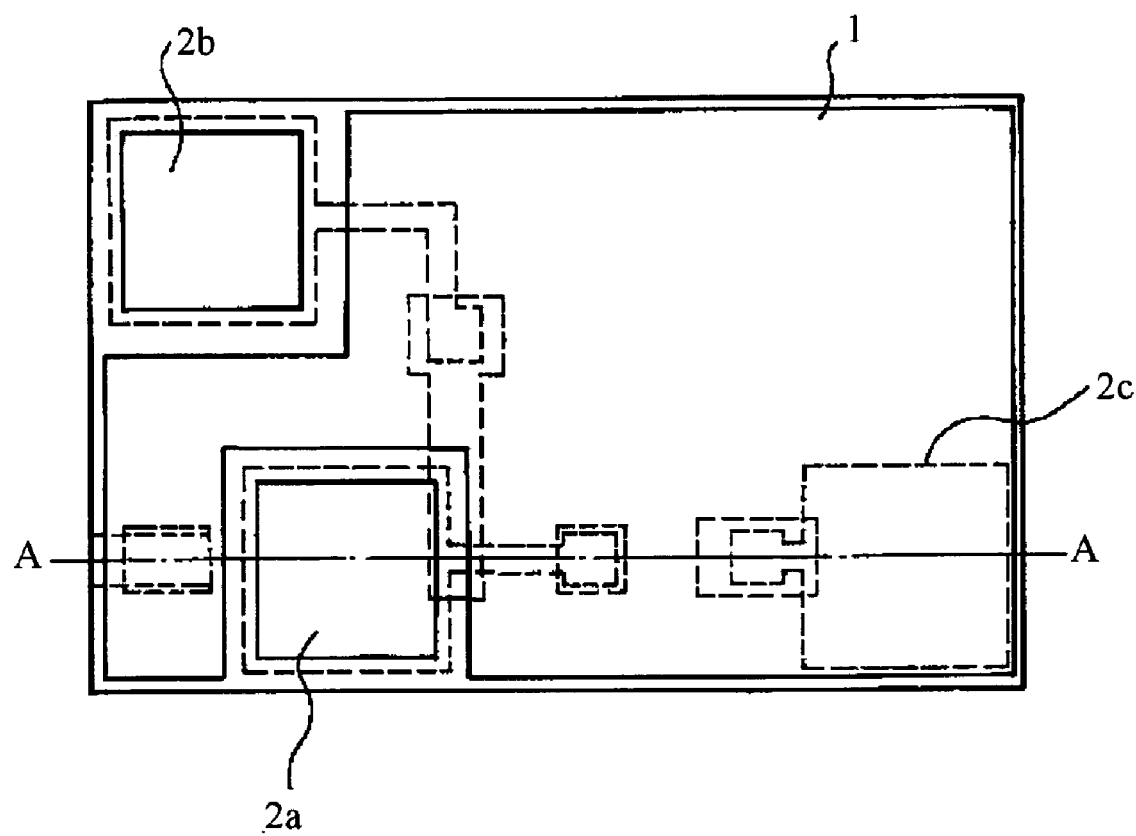
FIG. 18 is a top view showing a top-viewed structure of the conventional semiconductor integrated circuit.
Figure 19:
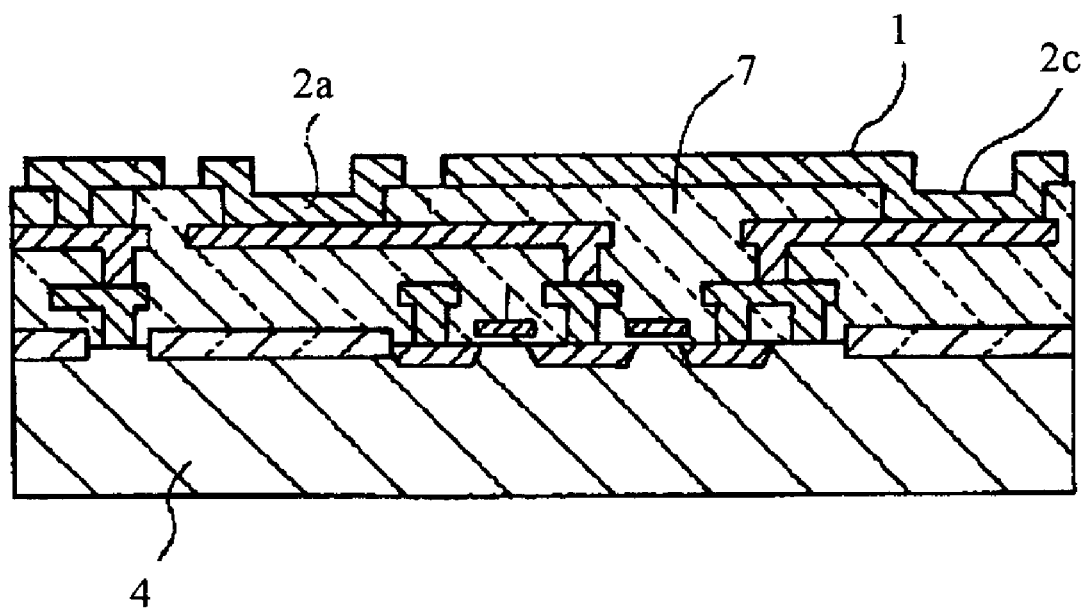
FIG. 19 is a sectional view showing a sectional structure of the conventional semiconductor integrated circuit.

FIG. 17 shows a top viewed configuration of an IC card 50 of eighth embodiment of the present invention. The IC card 50 is formed by sealing an IC card module 52 including the present invention devices 100 to 105 of the above first to seventh embodiments in the housing of the IC card 50. In the case of the IC card illustrated in FIG. 17, an antenna 51 is also sealed in the housing because a non-contact interface is included. According to this configuration, by using the present invention devices 100 to 105 of the first to seventh embodiments, circuit analyses for illegal purposes of the present invention devices 100 to 105 are prevented and decrease in thickness is realized without deterioration of an electrical characteristic retraining the warpage of a wafer. Therefore, it is possible to provide the thin high-performance IC card 50 from which it is very difficult to read circuit information.

Semiconductor integrated circuits of the present invention are described above in detail. The shielding film patterns illustrated for the above embodiments are examples. Therefore, a pattern is not restricted to the pattern shapes of the embodiments. Moreover, in the case of a structure of a semiconductor integrated circuit, dimensions of various portions including a film thickness and materials are not restricted to those illustrated for the above embodiments. They can be properly modified in the range of the technical thought of the present invention.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A semiconductor integrated circuit comprising:
a shielding film, substantially shielding passage of light to the semiconductor integrated circuit or substantially preventing electromagnetic radiation from being emitted from the semiconductor integrated circuit, formed by a material different from at least either of a semiconductor substrate and an interlayer insulating film in thermal expansion coefficient, wherein
said shielding film has shielding portions and openings such that at least either of a plurality of independent openings whose circumferences are surrounded by said shielding portions and a plurality of independent shielding portions whose circumferences are surrounded by said openings are present and scattered on the entire surface of said semiconductor substrate.

2. The semiconductor integrated circuit according to claim 1, wherein
the ratio of an area on the surface of the semiconductor substrate occupied by said shielding portions is 61% or less.

3. The semiconductor integrated circuit according to claim 2, wherein
the ratio of an area on the surface of the semiconductor substrate occupied by said shielding portions is 40% or more.

4. The semiconductor integrated circuit according to claim 1, wherein
said shielding portions are respectively formed by a conductive metallic material, and
at least a part of said shielding portions is electrically connected to a fixed potential.

5. The semiconductor integrated circuit according to claim 1, wherein
said shielding portions of said shielding film are respectively formed by a conductive metallic material and at least two layers of said shielding film are present on the surface of said semiconductor substrate,
at least a part of said shielding portions of each layer is electrically connected to a fixed potential,
said shielding films other than the uppermost layer one are a pattern formed so that one or more independent shielding portions whose circumferences are surrounded by said openings are present.

6. The semiconductor integrated circuit according to claim 1, wherein
at least two layers of said shielding films are present on the surface of said semiconductor substrate and said shielding film of the upper-layer is a pattern formed so that said shielding portions shield said openings of said shielding film of the lower-layer.

7. The semiconductor integrated circuit according to claim 6, wherein
the shielding film of the upper-layer is a pattern formed into an alternately repeating pattern in which at least either of the independent openings whose circumferences are surrounded by the shielding portions and the independent shielding portions whose circumferences are surrounded by the openings are alternately repeated in two directions orthogonal to each other, and
the shielding film of the lower-layer is said pattern formed into said alternately repeating pattern shifted in said two directions by the half of each respective pitch from the alternately repeating pattern of the upper-layer.

8. The semiconductor integrated circuit according to claim 1, wherein
a circuit portion is formed on a surface of said semiconductor substrate, and
a rough face, which is formed on the back of said semiconductor substrate, for irregularly reflecting infrared radiation incoming toward the surface of said semiconductor substrate from the back of said semiconductor substrate.

9. The semiconductor integrated circuit according to claim 1, wherein
at least one layer of said shielding film is present on both the surface and the back of said semiconductor substrate.

10. The semiconductor integrated circuit according to claim 1, wherein
the back of said semiconductor substrate has a crystal defect density which is greater than the front of the semiconductor substrate.

11. A semiconductor integrated circuit comprising:
a shielding film, substantially shielding passage of light to the semiconductor integrated circuit or substantially preventing electromagnetic radiation from being emitted from the semiconductor integrated circuit, formed by a material different from at least either of a semiconductor substrate and an interlayer insulating film in thermal expansion coefficient, wherein said shielding film has shielding portions and openings such that a plurality of the openings are present on an optional straight line parallel with a surface of said semiconductor substrate passing through a portion for shielding circuit devices and circuit wirings in said shielding portions.

12. The semiconductor integrated circuit according to claim 11, wherein the length of said shielding portions present on the straight line is 200 mm or less.

13. The semiconductor integrated circuit according to claim 11, wherein the ratio of an area on the surface of a semiconductor substrate occupied by said shielding portions is 61% or less.

14. The semiconductor integrated circuit according to claim 13, wherein the ratio of an area on the surface of the semiconductor substrate occupied by said shielding portions is 40% or less.

15. The semiconductor integrated circuit according to claim 11, wherein said shielding portions are respectively formed by a conductive metallic material, and at least a part of said shielding portions is electrically connected to the fixed potential.

16. The semiconductor integrated circuit according to claim 11, wherein said shielding portions of said shielding film are respectively formed by a conductive metallic material and at least two layers of the shielding film are present on the surface of said semiconductor substrate, at least a part of said shielding portions of each layer is electrically connected to a fixed potential, and said shielding films other than the uppermost layer one are a pattern formed so that one or more independent shielding portions whose circumferences are surrounded by said openings are present.

17. The semiconductor integrated circuit according to claim 11, wherein at least two layers of said shielding film are present on the surface of said semiconductor substrate and said shielding film of the upper-layer is a pattern formed so that said shielding portions shield the openings of said shielding film of the lower-layer.

18. The semiconductor integrated circuit according to claim 17, wherein said shielding film of the upper-layer is a pattern formed into an alternately repeating pattern in which at least either of an independent opening whose circumference is surrounded by said shielding portions and an independent shielding portion whose circumference is surrounded by said openings is alternately repeated in two directions orthogonal to each other, and said shielding film of the lower-layer is said pattern formed into said alternately repeating pattern shifted in said two directions by the half of a respective pitch from the alternately repeating pattern of the upper-layer.

19. The semiconductor integrated circuit according to claim 11, wherein a circuit portion is formed on the surface of said semiconductor substrate, and a rough face, which is formed on the back of said semiconductor substrate, for irregularly reflecting infrared radiation incoming toward the surface of said semiconductor substrate from said back of said semiconductor substrate.

20. The semiconductor integrated circuit according to claim 11, wherein at least one layer of said shielding film is present on both the surface and the back of said semiconductor substrate.

21. The semiconductor integrated circuit according to claim 11, wherein the back of said semiconductor substrate has a crystal defect density which is greater than the front of the semiconductor substrate.

22. An IC card on which the semiconductor integrated circuit of claim 1 is mounted.

23. An IC card on which the semiconductor integrated circuit of claim 11 is mounted.

24. A semiconductor integrated circuit, comprising:

a semiconductor substrate;

at least one wiring layer formed on the semiconductor substrate;

an insulating film; and a shielding film for protecting the at least one wiring layer from infrared radiation and preventing leakage of electromagnetic radiation from the semiconductor integrated circuit, wherein said insulating film is formed between the shielding film and the semiconductor substrate, said shielding film has shielding portions and openings, and the ratio of shielding portions to said shielding film is 40% or more.

* * * * *